(12) United States Patent
Kurasawa

(10) Patent No.: US 8,212,637 B2
(45) Date of Patent: Jul. 3, 2012

(54) ELECTROMAGNETIC SWITCH FOR A STARTER MOTOR

(75) Inventor: Tadahiro Kurasawa, Chita-gun (JP)

(73) Assignee: Denso Corporation, Kariya (JP)

( * ) Notice: Subject to any disclaimer, the term of this patent is extended or adjusted under 35 U.S.C. 154(b) by 219 days.

(21) Appl. No.: 12/726,823

(22) Filed: Mar. 18, 2010

(65) Prior Publication Data
US 2010/0237968 A1  Sep. 23, 2010

(30) Foreign Application Priority Data
Mar. 18, 2009  (JP) ................... 2009-065690

(51) Int. Cl.
*H01H 67/02* (2006.01)
(52) U.S. Cl. ......... 335/126; 335/131; 336/192; 439/877
(58) Field of Classification Search .......... 335/126–131, 335/251, 220–229, 121; 336/192; 439/877, 439/874, 511, 515, 878, 880, 83, 516, 881
See application file for complete search history.

(56) References Cited

U.S. PATENT DOCUMENTS

| | | | | | |
|---|---|---|---|---|---|
| 3,571,770 | A | * | 3/1971 | Dew | 335/256 |
| 4,931,728 | A | * | 6/1990 | Hata et al. | 324/207.15 |
| 5,132,655 | A | * | 7/1992 | Suzuki et al. | 336/192 |
| 5,157,367 | A | * | 10/1992 | Itoh et al. | 335/126 |
| 5,214,401 | A | * | 5/1993 | Kimura et al. | 335/126 |
| 5,291,170 | A | * | 3/1994 | Wahba et al. | 335/246 |
| 5,307,038 | A | * | 4/1994 | Ishimaru | 335/296 |
| 5,332,926 | A | * | 7/1994 | Ueno et al. | 307/10.6 |
| 5,423,117 | A | * | 6/1995 | Okada et al. | 29/605 |
| 5,548,260 | A | * | 8/1996 | Kogure et al. | 335/126 |
| 5,663,699 | A | * | 9/1997 | Shiroyama | 335/126 |
| 5,907,204 | A | * | 5/1999 | Matsushima et al. | 310/68 C |
| 6,930,576 | B2 | * | 8/2005 | Usami | 335/126 |
| 7,116,196 | B1 | | 10/2006 | Hirabayashi | |
| 7,414,501 | B2 | * | 8/2008 | Imanishi et al. | 335/132 |
| 7,545,248 | B2 | * | 6/2009 | Imanishi et al. | 335/202 |
| 7,549,899 | B2 | * | 6/2009 | Imanishi et al. | 439/877 |
| 7,760,056 | B2 | * | 7/2010 | Utsunomiya et al. | 335/126 |
| 2002/0145494 | A1 | * | 10/2002 | Andoh et al. | 335/126 |
| 2006/0132268 | A1 | | 6/2006 | Hirabayashi | |
| 2008/0122564 | A1 | * | 5/2008 | Utsunomiya et al. | 335/202 |

FOREIGN PATENT DOCUMENTS

| | | |
|---|---|---|
| JP | A-2006-177160 | 7/2006 |
| JP | A-2006-286258 | 10/2006 |

* cited by examiner

*Primary Examiner* — Mohamad Musleh
(74) *Attorney, Agent, or Firm* — Oliff & Berridge, PLC

(57) ABSTRACT

An electromagnet switch has a metal contact for a switch terminal that projects from a case and is wired to one end of a coil. A male connector member surrounds an outer periphery of the metal contact. The male connector member is connected to a female connector member that is provided at a tip end of a cable used for supplying electric power to the coil. Such a penetrating hole is formed in a case that reaches the metal contact.
A tester terminal can contact the metal contact through the penetrating hole for conducting conductive testing of the electromagnet switch, in a commercial field.

6 Claims, 5 Drawing Sheets

ELECTROMAGNETIC SWITCH FOR A STARTER MOTOR

CROSS-REFERENCE TO RELATED APPLICATION

This application is based on and claims the benefit of priority from earlier Japanese Patent Application No. 2009-65690 filed Mar. 18, 2009, the description of which is incorporated herein by reference.

BACKGROUND OF THE INVENTION

1. Technical Field of the Invention

The present invention relates to an electromagnetic switch, more particularly to a so-called connector type electromagnetic switch for a starter motor of an internal-combustion engine to control electric power to the motor.

2. Description of the Related Art

Engine starters are commonly used to start internal-combustion engines mounted on vehicles. An engine starter includes a motor (hereinafter called as a starter motor) as a driving source to start an internal-combustion engine.

The starter motor has an electromagnetic switch to control electric power. The electromagnetic switch includes a coil for energizing and a contact mechanism for connecting and disconnecting an electric power to a subsequent element.

The coil energized by the electric power generates a magnetomotive force that connects and disconnects the contact mechanism. The connection and disconnection of the contact mechanism controls electric power to the starter motor.

More specifically, the electromagnetic switch includes a switch coil that is connected to an ignition switch through a switch terminal. Once the ignition switch is turned on, the switch coil is supplied with a current from a battery and serves as an electromagnet.

A plunger, a ferromagnet, is slidably disposed inside the switch coil. Once the electromagnet is formed, an attraction force between a fixed iron core provided to a magnetic circuit of the electromagnet and the plunger is generated. This causes the plunger to move toward the fixed iron core, which thereby closes the main contact of the starter motor.

On the other hand, once the ignition switch is turned off, the current flow to the switch coil is interrupted. This acts to extinguish the attraction force acting between the fixed iron core and the plunger, causing the plunger to be pushed back by the compressive force of a return spring, thereby opening the main contact.

The switch terminal includes two types: one type is a so called "bolt type" switch terminal in which an electric conductor is fixed with a nut; the other type is so called a "connector type" switch terminal in which the electric conductor is connected with a connector formed at a tip end of the electric conductor.

The former switch terminal is disclosed in Japanese Patent Application Laid-Open Publication No. 2006-286258. The electromagnetic switch disclosed in this Patent Publication is constructed in such a manner that a head portion of a bolt of the switch terminal is insert-molded in a case of the electromagnetic switch, and a shaft portion of the bolt projects outwardly from the case.

The bolt is connected to one end of a coil inside the case, electrically conducting to the coil. One end of the electric conductor connected to the ignition switch forms a wire connection portion. The wire connection portion is tightened by the nut to the shaft portion of the bolt, thereby fixing the electric conductor to the switch terminal.

The latter electromagnetic switch, the connector type electromagnetic switch, is disclosed in Japanese Patent Application Laid-Open Publication No. 2006-177160. The electromagnetic switch in this Patent Publication includes a metal connector for a switch terminal that is inserted in a case and is connected to one end of the coil.

A part of the metal connector projects outward from the case. The metal connector has such a male connector member integrally formed with the case that accommodates an outer periphery of the portion of the metal connector projecting outward from the case.

The male connector member is adapted to engage with a female connector member. The female connector member is formed at an end portion of an electric conductor that is connected to an ignition switch. The engagement between the female connector member and the electric conductor allows the electric conductor to be electrically connected to the switch terminal.

Vehicles with electrical failures in every day life may be subject to testing of the electrical connections in order to determine its cause. The test may be conducted by applying a tester terminal to a conductive portion between the wiring and a terminal of each piece of equipment in order to determine electrical connections and contact resistance.

This testing also determines an electrical connection of the electromagnetic switch of an engine starter. In this testing, a bolt type switch terminal allows the tester terminal to make a direct contact with the terminal with the wiring kept connected, because it has a portion exposed near the wire connection portion. However, the connector type switch terminal was not able to allow the testing with the wiring kept connected, because the terminal does not have an exposed portion.

SUMMARY OF THE INVENTION

The present invention has been invented based on such considerations, and it is therefore an object of the present invention to provide a connector type electromagnetic switch that allows testing of electric connections of its switch terminal with the wiring kept connected.

In an electromagnetic switch according to a first aspect, the electromagnetic switch comprises a coil that serves as an electromagnet when energized by an supplied current. The switch further comprises a contact mechanism that is opened and closed by the magnetic force of the coil indirectly.

It further comprises a case that accommodates the contact mechanism. The switch further comprises a metal contact for a switch terminal that is wired to one end of the coil. The metal contact has a portion projecting from the case.

The switch also comprises a connector member integrally constructed with the case. The connector member covers an outer periphery of the portion of the metal contact projecting from the case. The case has a penetrating hole that penetrates through from an outside the case to the metal contact.

In such a construction a conductive testing for a connector type electromagnetic switch can be conducted by a tester terminal that is contacted to the metal contact through the penetrating hole, with the wiring kept connected.

In the electromagnetic switch according to a second aspect, the electromagnetic switch comprises a penetrating hole that is disposed in such a manner that its axis line intersects with the metal contact.

In the electromagnetic switch according to a third aspect, the electromagnetic switch has such a sealing means provided in a space between the underneath of the penetrating hole and the metal contact. The sealing means has a recessed portion that is disposed along an axis of the penetrating hole.

In the electromagnetic switch according to a fourth aspect, the electromagnetic switch has a lid that is detachably fitted to an opening of the penetrating hole.

In the electromagnetic switch according to a fifth aspect, the electromagnetic switch has the lid provided with a sealing member.

In the electromagnetic switch according to a sixth aspect, the electromagnetic switch has such a plug having an expansion hole that is fitted into the penetrating hole.

DETAILED DESCRIPTION OF PREFERRED EMBODIMENTS

Preferred embodiments according to the present invention will be described with reference to the drawings.

First Embodiment

An electromagnetic switch of a first embodiment according to the present invention will be described referring to FIGS. 1 to 3.

Figure 1:
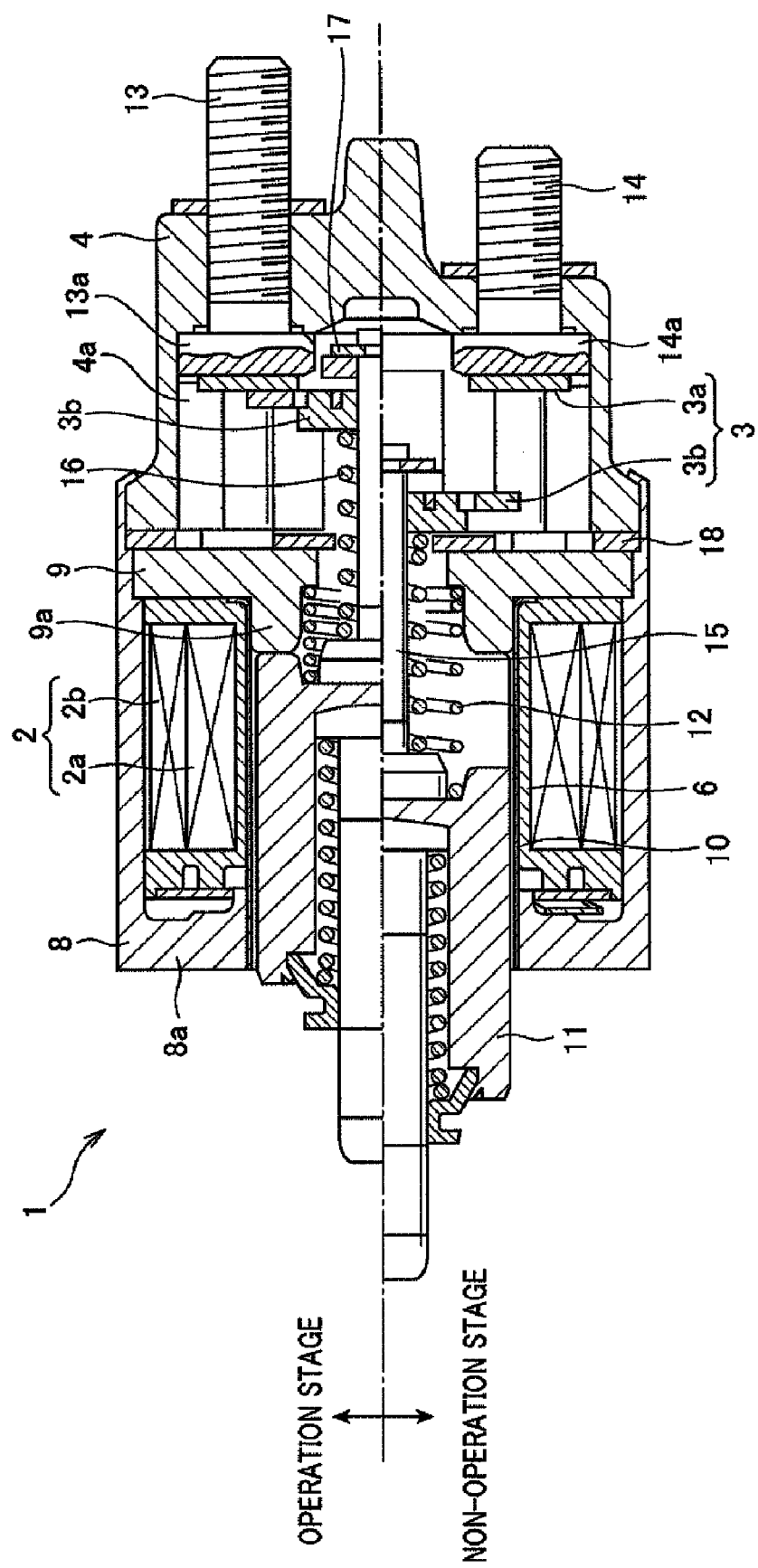
FIG. 1 is a sectional view along an axial direction of an electromagnet switch where the centerline shows an operation stage while below the centerline showing a non-operation stage.
Figure 2:
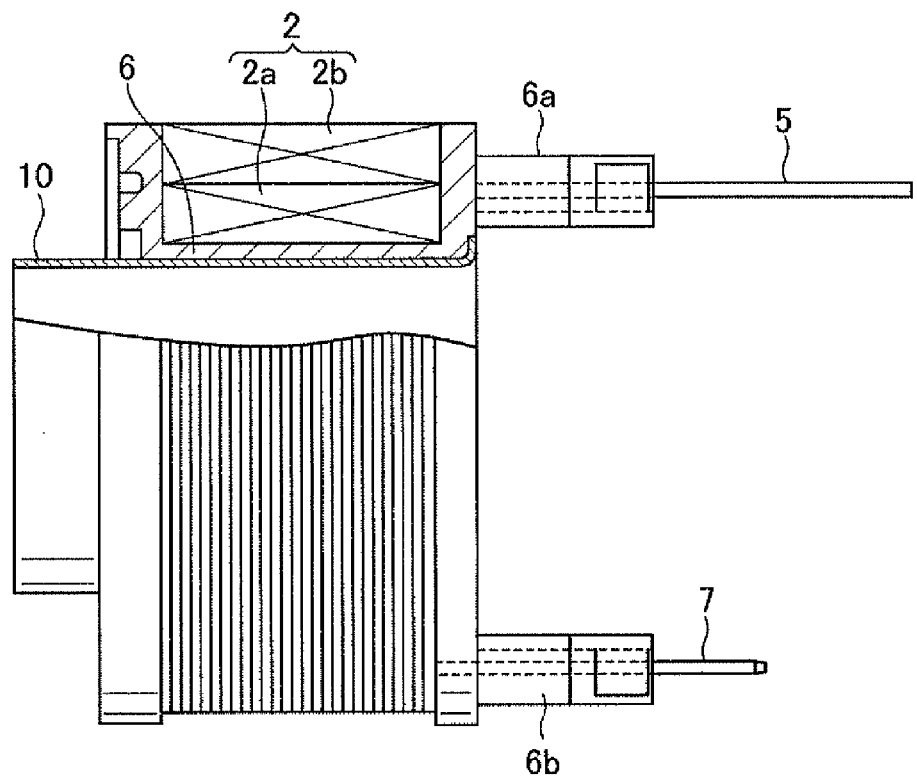
FIG. 2 is a sectional view along the axial direction showing a bobbin wound by a coil.
Figure 3:
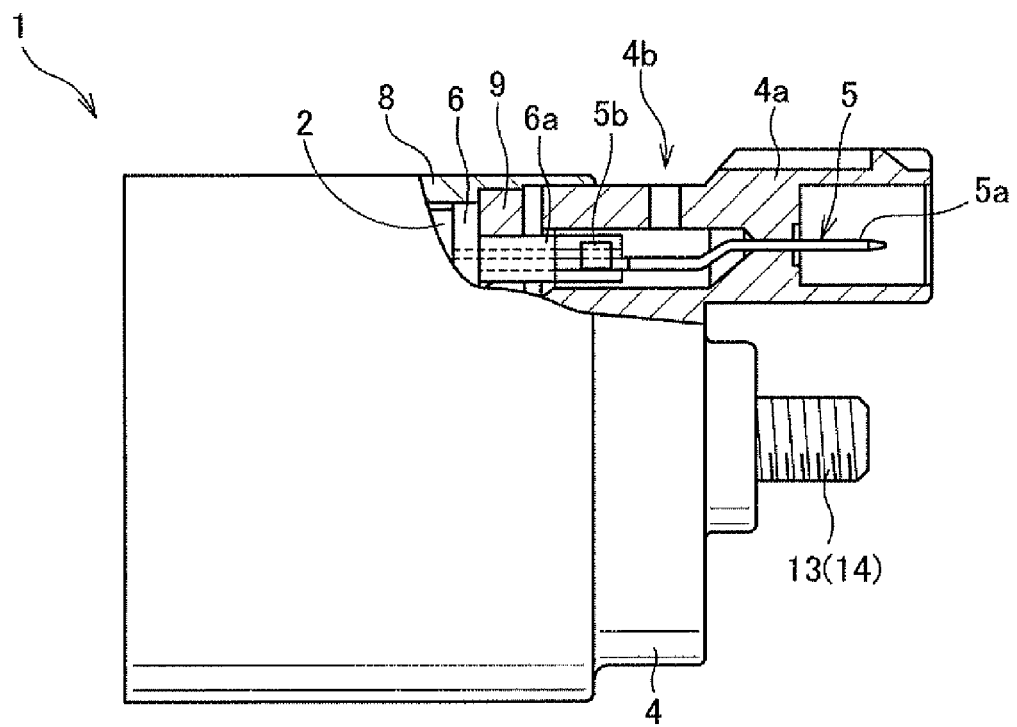
FIG. 3 is a sectional view showing a substantial part of the electromagnet switch (first embodiment)

As shown in FIGS. 1-3, the electromagnetic switch 1 comprises a coil 2 that serves as an electromagnet in a conducting stage. It further comprises a contact mechanism 3 that is opened and closed indirectly by the magnetic force of the coil 2.

The switch 1 further comprises a case 4 that accommodates the contact mechanism 3. It further comprises a metal contact 5 for a switch terminal that is connected to one end of the coil 2. The metal contact 5 partly projects from the case 4.

The electromagnetic switch 1 also comprises a male connector member 4a (a connector member) that is formed as a part of the case 4, and that accommodates a projected portion 5a of the metal contact 5.

The coil 2 consists of an attraction coil 2a and a holding coil 2b, which are wound around a bobbin 6 in a double layer manner. The bobbin 6 has a cylindrical form having a flange portion at both ends. The flange portion formed at one end of the bobbin 6 is provided with a switch terminal fixing portion 6a and a motor-terminal fixing portion 6b, both projecting from the flange portion.

The switch terminal fixing portion 6a secures the metal contact 5, and the motor-terminal fixing portion 6b secures a motor-terminal metal contact 7. One end of each of the attraction coil 2a and the holding coil 2b is wired to the metal contact 5, and the other end of the attraction coil 2a is wired to the motor-terminal metal contact 7.

The other end of the holding coil 2b is grounded through, for example, a stationary core 9. The bobbin 6 is accommodated in a yoke 8, which will be described below.

The yoke 8 has a cylindrical form having a bottom wall 8a at its one end, and is made of metal materials such as iron. Disposed at the bottom wall 8a of the yoke 8 is the bobbin 6, to which the coil 2 is wound.

The stationary core 9 is caulked to an opening side of the yoke 8, holding the bobbin 6 between the stationary core 9 and the bottom wall 8a of the yoke 8. The stationary core 9 includes at its inner circumference a projected portion 9a that projects in an axial direction.

The projected portion 9a fits into a recessed portion of the bobbin 6. A plunger 11 is inserted into the recessed portion of the bobbin 6 at a side of the bottom wall 8a through a sleeve 10 that allows the plunger 11 to smoothly move in the axial direction.

The plunger 11 is pushed to the side of the bottom wall 8a of the yoke 8 by a return spring 12 that is disposed between the stationary core 9 and the plunger 11.

The contact mechanism 3 consists of a pair of fixed contacts 3a and a moving contact 3b. The fixed contacts 3a are fixed inside the case 4, and the moving contact 3b is driven by an indirect contact of a magnetic force of the coil 2.

The pair of fixed contacts 3a are integrally attached to head portions 13a, 14a of respective terminal bolts 13, 14 that are projectively mounted to a bottom portion of the case 4. The case 4 will be described below. The bolt 13 has a shaft portion that is connected to a battery cable (not shown) connected to a battery (not shown). The bolt 14 also has a shaft portion that is connected to a lead (not shown) of a motor (not shown).

The moving contact 3b is disposed at a tip end side of a rod 15 capable of moving in the axial direction. The rod 15 is press fit to the plunger 11 at a side of the stationary core 9. The moving contact 3b is pushed toward a side of the fixed contact 3a by a contact spring 16 that is disposed around the rod 15 between the plunger 11 and the moving contact 3b.

When the electromagnetic switch 1 is not energized, the moving contact 3b stays by a stopper 17 by a compressive force of the contact spring 16. The stopper 17 is fixed to a tip end of the rod 15. When the electromagnetic switch 1 is energized, the moving contact 3b is forced to contact the fixed contacts 3a, as the moving contact 3b leaves from the stopper 17 and as the contact spring 16 contracts.

In this stage a contact pressure between the moving contact 3b and the fixed contacts 3a is accelerated by the return spring 12. The mechanical contact between the moving contact 3b and the fixed contacts 3a makes a battery (not shown) electrically connected to a motor (not shown).

The case 4 has a cylindrical form having a bottom wall and is made of resin, for example. Inside the case 4, there is formed a contact room 4a for installing the contact mechanism 3. At a bottom portion of the case 4, the bolts 13, 14 are insert-molded.

As described above, the pair of fixed contacts 3a are provided at the head portions 13a, 14a of the bolts 13, 14 inside the contact room 4a. Further, at the bottom portion of the case 4, a slit is formed at a certain distance from the bolts 13, 14 for allowing the metal contact 5 to pass therethrough, which will be described below.

An opening portion of the case 4 fits into an inner side of an opening portion of the yoke 8 and is secured by caulking. A seal packing 18 is provided between the case 4 and the stationary core 9 for preventing water from intruding into an interior of the electromagnetic switch 1 through a gap between the case 4 and the yoke 8.

The metal contact 5 has one end that is press fit to a terminal fixing portion 6a of the bobbin 6. The switch terminal metal contact 5 is provided with an arm portion 5b near the portion that is press fit.

End portions of the attraction coil 2a and the holding coil 2b are fixedly wired with the arm portion 5b by caulking. The other end portion of the metal contact 5 penetrates through the slit formed at the bottom portion of the case 4, forming a projected portion 5a designated by a portion projecting outside the case 4.

The male connector member 4a projects from the bottom portion of the case 4 so as to cover an outer periphery of the projecting portion 5a. The male connector member 4a is fitted and electrically connected to a female connector member (not shown) that is formed at a tip end of a cable for energizing a coil.

The coil is connected to an ignition switch that is operated when a driver starts an engine.

The preferred embodiment of the present invention includes a penetrating hole 4b. The penetrating hole 4b will be described hereafter referring to FIG. 3.

The penetrating hole 4b is formed in such a manner that it penetrates through between an outer periphery of the case 4 and a space in which the metal contact 5 is installed. This allows equipment such as a tester terminal to reach the metal contact 5 through the penetrating hole 4b from an outside. The penetrating hole 4b is formed so that its axial line intersects with the metal contact 5.

An operation of the electromagnetic switch 1 will be described referring to FIG. 1.

In FIG. 1, an upper side above the centerline illustrates an operation stage where the plunger 11 is attracted by the stationary core 9, while the lower side below the centerline shows a non-operation stage where the plunger 11 is pushed back by a compressive force of the return spring 12.

A closing operation of the ignition switch (i.e., turning the switch ON) by a driver energizes the coil 2, which magnetizes the stationary core 9. This generates an attraction force between the stationary core 9 and the plunger 11, thereby attracting the plunger 11 to the stationary core 9, which moves the plunger 11 to the right direction in FIG. 1, while the return spring 12 is contracted.

The movement of the plunger 11 causes the moving contact 3b, which is supported by the end portion of the rod 15, to contact the pair of fixed contacts 3a, thereby closing the contact mechanism 3. This causes the motor to be energized by a current supplied from the battery and starts the engine, as a pinion gear rotated by the motor rotates a ring gear of the engine.

An opening operation of the ignition switch (i.e., turning the switch OFF) while the engine is running terminates the electric supply to the coil 2, which extinguish the attraction force, thereby forcing the plunger 11 to be pushed back to the left side in FIG. 1 by a compressive force of the return spring 12. This action causes the moving contact 3b to disconnect from the pair of fixed contacts 3a, opening the contact mechanism 3. Simultaneously, the supply of electricity to the motor is terminated.

Effect of the First Embodiment

According to this preferred embodiment, the penetrating hole 4b formed in the case 4, which penetrates through to the space for installing the metal contact 5, allows conductive testing of the electromagnetic switch 1, without disconnecting the female connector member, which is connected to the cable for energizing the coil, from the male connector member 4a. Thus, the conductive testing can be conducted merely by inserting a tester terminal into the penetrating hole 4b to contact the metal contact 5.

Further, the penetrating hole 4b is formed such that its axial line intersects with the metal contact 5 that allows the tester terminal having a stick form to consequently make contact with the metal contact 5, by simply placing the tester terminal in the penetrating hole 4b. This allows easier conductive testing.

Second Embodiment

Figure 4:
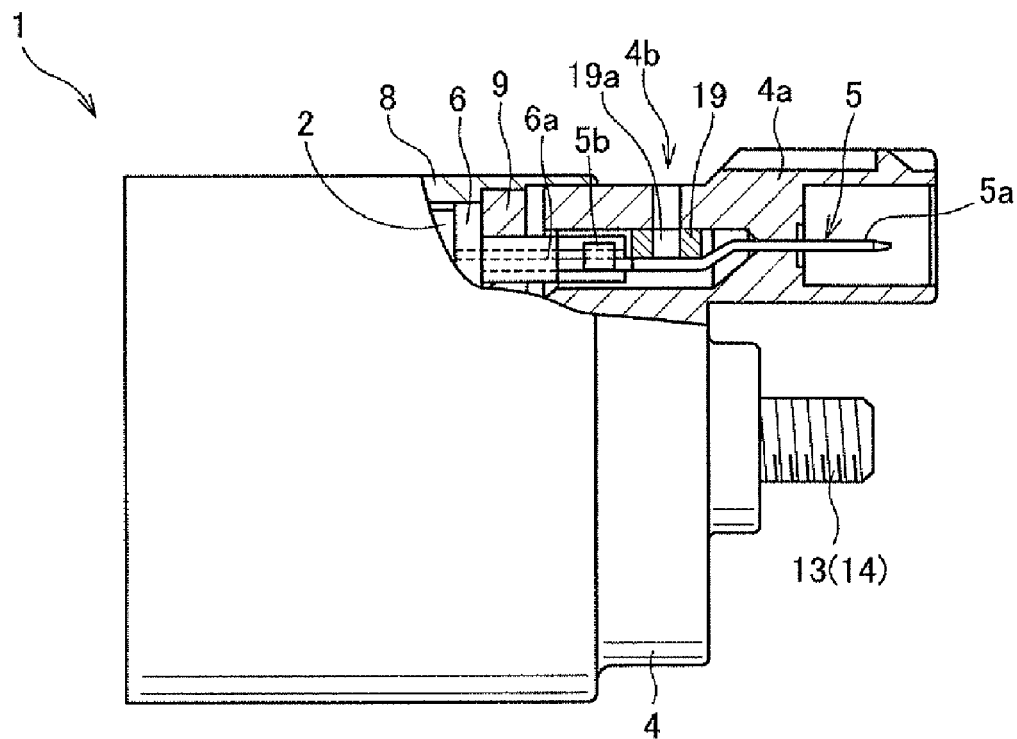
FIG. 4 is a sectional view showing a substantial part of the electromagnet switch (second embodiment)

A second embodiment of the present invention is shown in FIG. 4. This electromagnetic switch 1 includes a sealing means 19 having a recessed portion 19a that is coaxial to the penetrating hole 4a. The sealing means 19 is disposed between an internal side of the penetrating hole 4b of the case 4 and the metal contact 5.

The sealing means 19 prevents any ambient water from spreading and intruding into the contact room 4a and any other rooms, even if the ambient water intrudes in the recessed portion 19a of the sealing means 19 through the penetrating hole 4b. This prevents any failures of the electromagnetic switch 1 caused by the water.

The electromagnetic switch 1 according to the second embodiment of the invention provides the same construction and advantages as the first embodiment of the invention in other parts.

Third Embodiment

Figure 5:
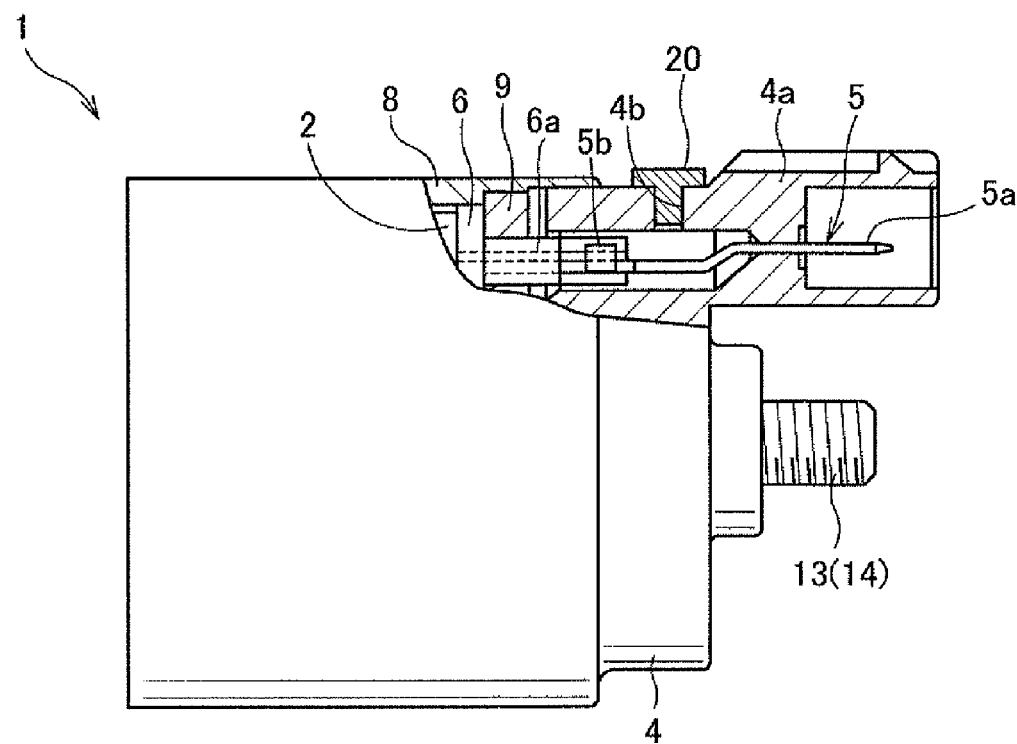
FIG. 5 is a sectional view showing a substantial part of the electromagnet switch (third embodiment)

A third embodiment of the invention is shown in FIG. 5, in which the electromagnetic switch 1 is provided with a lid 20 that is detachably disposed to an opening portion of the penetrating hole 4b.

The lid 20 can prevent ambient water from intruding into the penetrating hole 4b. Since the lid 20 is detachable, it can be removed when inserting the tester terminal into the penetrating hole 4b for conductive testing.

The electromagnetic switch 1 according to the third embodiment of the invention provides the same construction and advantages as the first embodiment of the invention in other parts.

Fourth Embodiment

Figure 6:
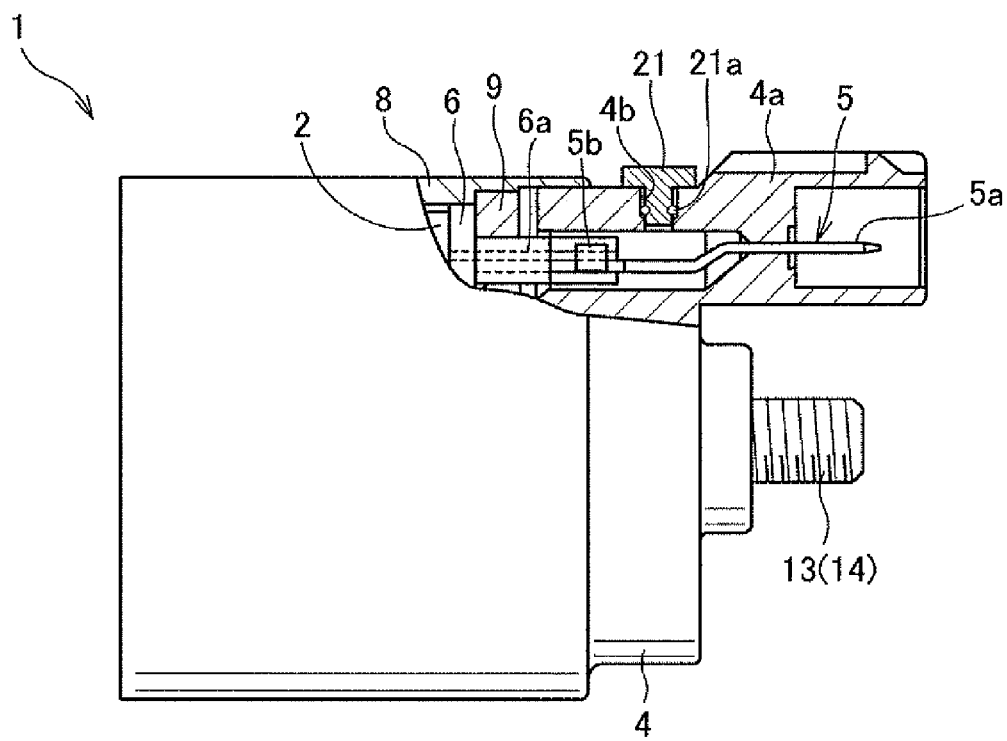
FIG. 6 is a sectional view showing a substantial part of the electromagnet switch (fourth embodiment)

A fourth embodiment of the electromagnetic switch 1 is shown in FIG. 6, which includes a lid 21 removably fitted to the opening portion of the penetrating hole 4b. The lid 21 is provided with an O-ring 21a (a sealing member) at its outer periphery surface that abuts the inner periphery surface of the penetrating hole 4b.

This construction can firmly prevent water from intruding into the interior of the switch 1 through a gap between the inner periphery surface of the penetrating hole 4b and the lid 21.

The electromagnetic switch 1 according to the fourth embodiment of the invention provides the same construction and advantages as the first embodiment of the invention in other parts.

Fifth Embodiment

Figure 7:
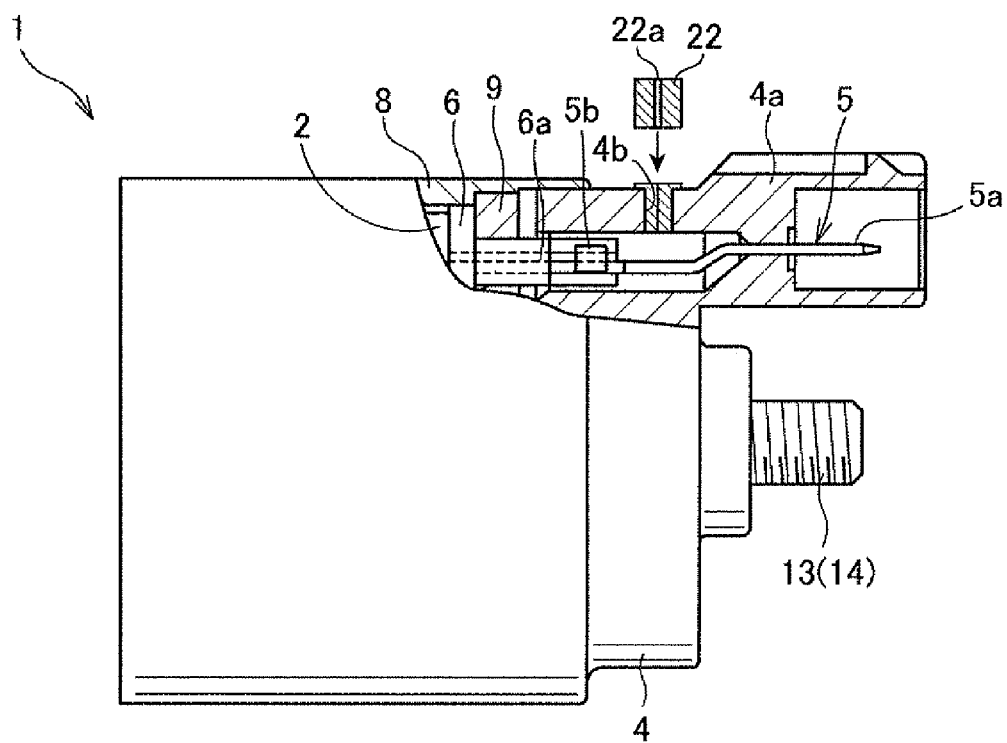
FIG. 7 is a sectional view showing a substantial part of the electromagnet switch (fifth embodiment)

A Fifth embodiment of the electromagnetic switch 1 is shown in FIG. 7. The switch 1 includes such a plug 22 having a circular form that is inserted into the penetrating hole 4*b*. The plug 22 is provided with an expansion hole 22*a* that expands and contracts.

The plug 22 can be made of resilient materials such as a rubber. The plug 22 is air-tightly fitted into the penetrating hole 4*b*, contracting the plug 22 in a radial inner direction thereby closing the expansion hole 22*a*.

In a normal state, the plug 22 fitted in the penetrating hole 4*b* can prevent ambient water from intruding into the interior of the switch 1 because of the expansion hole 22*a* that is closed.

When performing a conductive testing, the plug 22 allows the tester terminal to press into the expansion hole 22*a* that is opened as the terminal is inserted.

When the tester terminal is pulled out from the expansion hole 22*a* after completion of the conductive testing, the expansion hole 22*a* returns to its original closed state and provides its sealing performance again.

Unlike the third and fourth embodiments that have lids 20, 21 in the penetrating hole 4*b*, respectively, the fifth embodiment of the switch 1 allows the conductive testing easier since no operations are required for removing and placing the lid.

The electromagnetic switch 1 according to the fifth embodiment of the invention provides the same construction and advantages as the first embodiment of the invention in other parts.

Sixth Embodiment

Figure 8:
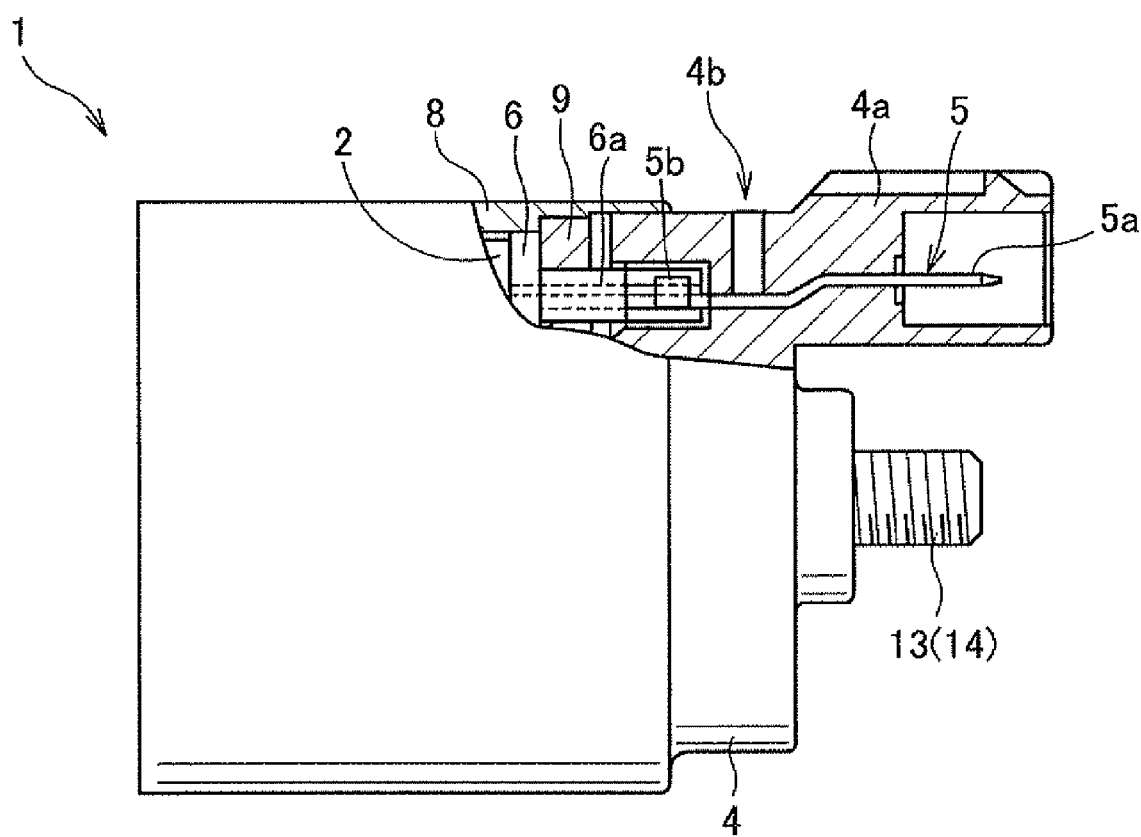
FIG. 8 is a sectional view showing a substantial part of the electromagnet switch (sixth embodiment).

A sixth embodiment of the electromagnetic switch 1 is shown in FIG. 8, in which the metal contact 5 is insert-molded with the case 4. Such a construction is dissimilar to that of the first embodiment in which the metal contact 5 is inserted into the slit formed in the case 4.

The insert molding process requires a jig having a stick form for positioning the metal contact 5 in a die mold. Consequently, the jig forms the penetrating hole 4*b* that reaches the metal contact 5 in the case 4. Thus, no extra work is required to form the penetrating hole 4*b*, and the hole formed by the jig can be used as the penetrating hole 4*b* for conductive testing.

The electromagnetic switch 1 according to the sixth embodiment of the invention provides the same construction and advantages as the first embodiment of the invention in other parts.
(Modification)

In the fifth embodiment of the electromagnetic switch 1, a valve may be provided to the penetrating hole 4*b* instead of the plug 22. The valve may have one end that is fixed to the penetrating hole 4*b* at a side of the case 4, and also have the other end that is free, thereby forming a cantilever structure.

With such a structure, the valve, in a normal state, can seal the penetrating hole 4*b* from its inner side and prevent ambient water from intruding into the interior. During conductive testing, the valve is forced to bend by a load from a tip end of a tester terminal as the tester terminal is inserted into the penetrating hole 4*b*, thereby allowing the tester terminal to contact the metal contact 5.

What is claimed is:

1. An electromagnetic switch for a starter motor comprising:
    a coil to be energized to serve as an electromagnet when supplied with a current;
    a contact mechanism to be opened and closed by the magnetic force of the coil;
    a case accommodating the contact mechanism;
    a metal contact for a switch terminal wired to one end of the coil, the metal contact having a portion projecting from the case; and
    a connector member integrally constructed with the case, the connector member covering an outer periphery of a portion of the metal contact projecting from the case; wherein
    the case is provided with a penetrating hole, the penetrating hole is formed from outside the case toward the metal contact.

2. The electromagnetic switch for a starter motor according to claim 1, wherein
    the penetrating hole is disposed in such a manner that an axis line of the penetrating hole intersects with the metal contact.

3. The electromagnetic switch for a starter motor according to claim 1, wherein
    a sealing means is provided in a space between an inner opening of the penetrating hole and the metal contact.

4. The electromagnetic switch for a starter motor according to claim 1, wherein
    the penetrating hole has an opening portion, the opening portion being detachably provided with a lid.

5. The electromagnetic switch for a starter motor according to claim 4, wherein
    the lid is provided with a sealing member.

6. The electromagnetic switch for a starter motor according to claim 1, wherein
    the penetrating hole is provided with a plug having an expansion hole.

* * * * *